United States Patent
Lee et al.

(10) Patent No.: US 6,197,664 B1
(45) Date of Patent: Mar. 6, 2001

(54) METHOD FOR ELECTROPLATING VIAS OR THROUGH HOLES IN SUBSTRATES HAVING CONDUCTORS ON BOTH SIDES

(75) Inventors: Michael G. Lee, San Jose; Michael G. Peters, Santa Clara; William T. Chou, Cupertino, all of CA (US)

(73) Assignee: Fujitsu Limited (JP)

( * ) Notice: Subject to any disclaimer, the term of this patent is extended or adjusted under 35 U.S.C. 154(b) by 0 days.

(21) Appl. No.: 09/229,503

(22) Filed: Jan. 12, 1999

(51) Int. Cl.$^7$ ........................... H01L 21/326
(52) U.S. Cl. ........................... 438/466; 216/17
(58) Field of Search ........................ 438/692, 667, 438/633, 754, 756, 697; 216/17, 18; 205/222

(56) References Cited

U.S. PATENT DOCUMENTS

| | | | |
|---|---|---|---|
| 3,573,175 | 3/1971 | Bedi | 204/15 |
| 4,348,253 | 9/1982 | Subbarao et al. | 156/643 |
| 4,368,106 | 1/1983 | Anthony | 204/15 |
| 4,396,467 | 8/1983 | Anthony | 204/15 |
| 4,466,864 | 8/1984 | Bacon et al. | 204/15 |
| 4,956,313 | 9/1990 | Cote et al. | 437/203 |
| 5,148,265 | 9/1992 | Khandros et al. | 357/80 |
| 5,256,274 | 10/1993 | Poris | 205/123 |
| 5,346,861 | 9/1994 | Khandros et al. | 437/209 |
| 5,358,621 | 10/1994 | Oyama | 205/123 |
| 5,368,711 | 11/1994 | Poris | 204/193 |
| 5,406,446 | * 4/1995 | Peters et al. | 361/306.1 |
| 6,039,889 | * 3/2000 | Zhang et al. | 216/17 |

* cited by examiner

Primary Examiner—Matthew Smith
Assistant Examiner—Calvin Lee
(74) Attorney, Agent, or Firm—Coudert Brothers

(57) ABSTRACT

A method for plating conductive material in through apertures and blind apertures of a substrate which has a conductive material on its upper and lower surfaces. In a typical configuration for plating a via, there is a first region of conductive material adjacent to, but outside of, the aperture which forms the via and a second region of conductive material inside of the aperture. The second conductive region is selected to be the cathode of the plating process. The structure is placed in a plating bath, a first potential is applied to the first region of conductive material, and a second potential is applied to the second region of conductive material, with the second potential being different from the first potential. Under these conditions, material will plate onto the second region of conductive material to fill the aperture. The value of the first potential is preferably selected to substantially reduce the rate at which the first region of conductive material is etched by the plating bath, and may be used to cause material to be plated onto first region, but at a slower rate than the plating of the second conductive region.

9 Claims, 1 Drawing Sheet

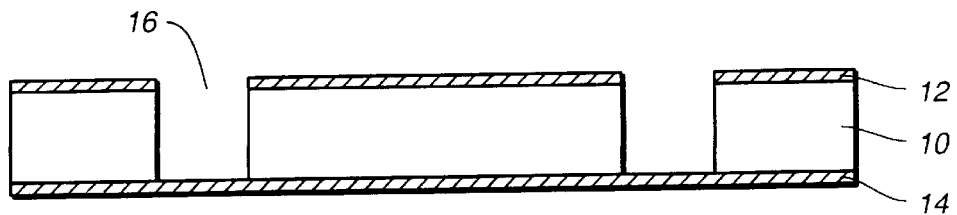
FIG._1
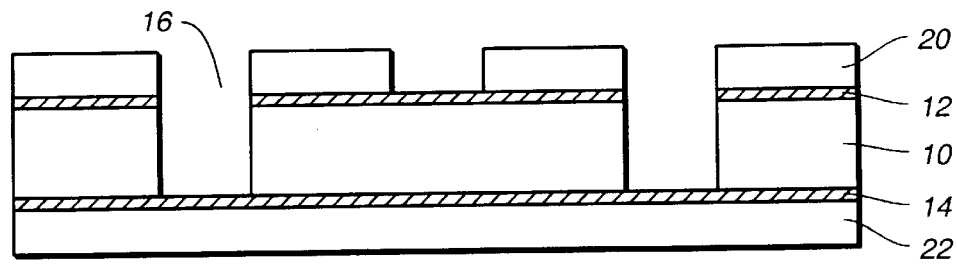
FIG._2
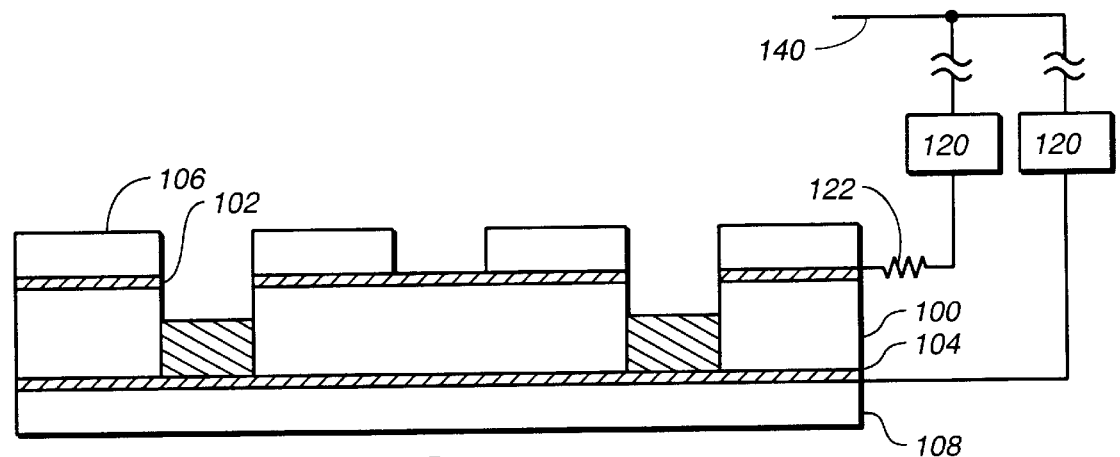
FIG._3
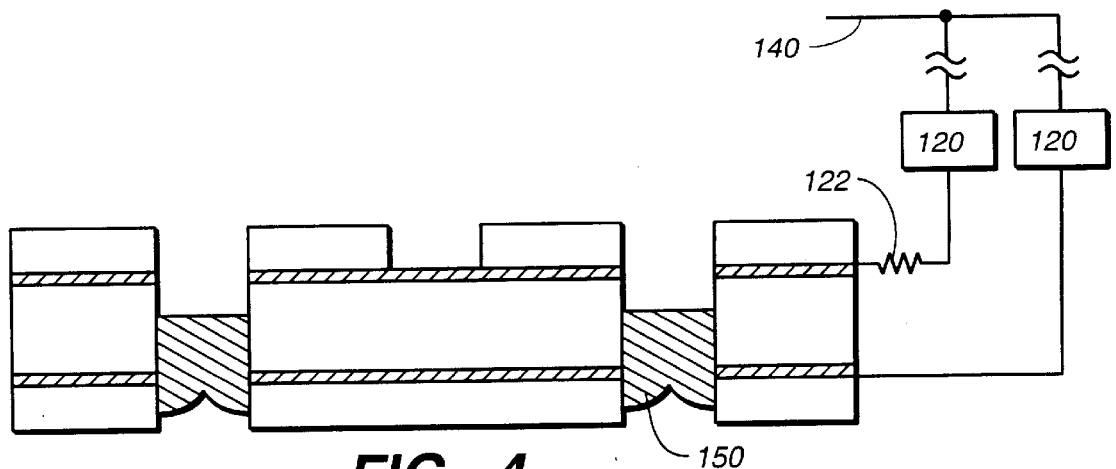
FIG._4

METHOD FOR ELECTROPLATING VIAS OR THROUGH HOLES IN SUBSTRATES HAVING CONDUCTORS ON BOTH SIDES

BACKGROUND OF THE INVENTION

1. Field of the Invention

The present invention relates to the plating of conductive material onto a substrate during the fabrication of semiconductor devices, and more specifically, to methods for plating conductive material in through holes and blind apertures of a substrate having conductors on both its upper and lower surfaces.

2. Description of the Prior Art

In fabrication of printed circuit boards (PCBs) and multichip modules (MCMs), it is often desired to plate the inside surfaces of a through-hole or blind aperture formed in a substrate with a conductive material. Once the conductive material is plated, a through hole is often referred to as a through via, and a blind aperture is often referred to as a blind via. Through vias are used to connect electrical traces which are on opposite sides of a PCB board or MCM substrate, and blind vias are used to connect electrical traces within the body of such board and substrates to one another and to traces on the surfaces of the board or substrate.

There is a demand in the semiconductor industry for an increasing density of electrical traces and interconnections, which often requires a high density of through vias and blind vias at smaller aperture diameters and higher aspect ratios (i.e., the ratio of length:diameter). In meeting this demand for higher trace and interconnection densities, it would be advantageous to be able to construct a structure formed from alternating conductive and dielectric layers before forming the apertures for the through vias and/or blind vias. In such a case, it would be desirable to fill the apertures with a conductive material (e.g., metal) by a plating process which used one of the conductive layers as the plating cathode. However, when it is attempted to use a conventional plating process to fill the apertures in this manner, it is found that the conductive layer(s) not acting as the cathode are etched away by the plating bath, which is usually acidic.

A possible solution to this problem is to mask the non-cathode conductive layers with a material which is resistant to the plating bath, e.g., photoresist. However, this requires additional processing steps to apply and remove the protective layer, and in many cases cannot be practically applied to the case where the alternating material layers are formed prior to the formation of the apertures.

What is desired is a method for plating through holes and vias formed in a substrate having a conductor on its top and bottom surfaces with a conductive material, which does not require a substantial increase in processing steps and which is compatible with the above-described multi-layer construction method.

SUMMARY OF THE INVENTION

The present invention is directed to a method for plating conductive material in through apertures and blind apertures of a substrate which has a conductive material or layer on its upper (top) and lower (bottom) surfaces. In a typical configuration for plating a via, there is a first region of conductive material adjacent to, but outside of, the aperture which forms the via and a second region of conductive material inside of the aperture, e.g., a portion of a conductive layer formed over the substrate. The second conductive region is selected to be the cathode of the plating process. The substrate/via structure is placed in a plating bath, a first potential is applied to the first region of conductive material, and a second potential is applied to the second region of conductive material, with the second potential being different from the first potential. Under these conditions, and with properly selected values for the first and second potentials, material will be selectively plated onto the second region of conductive material to fill the aperture. The value of the first potential is preferably selected to substantially reduce the rate at which the first region of conductive material is etched by the plating bath, and may be used to cause material to be plated onto first region, but at a slower rate than the plating of the second conductive region.

BRIEF DESCRIPTION OF THE DRAWINGS

FIG. 1 is a cross-sectional side view of a substrate having a conductive material on its upper and lower surfaces.

FIG. 2 is a cross-sectional side view of the substrate of FIG. 1, where a dielectric material has been deposited over the conductive material on the upper and lower surfaces of the substrate.

FIG. 3 is a cross-sectional side view of a substrate, showing how the inventive method may be used to plate a blind via in a substrate having a conductive material on its upper and lower surfaces.

FIG. 4 is a cross-sectional side view of a substrate, showing how the inventive method may be used to plate a through hole in a substrate having a conductive material on its upper and lower surfaces.

DETAILED DESCRIPTION OF THE INVENTION

The present invention is directed to a method for plating a via or a through hole in a substrate with a conductive material, where the substrate has a conductive material or layer formed on its upper and lower surfaces. The inventors have discovered that it is not advantageous to apply the same potential to both the upper and lower conductive surfaces, as this causes material to be plated onto the surfaces at approximately equal rates. Such a configuration may even cause material to be plated onto one of the surfaces at a faster rate if the plating process at that surface depletes metal ions for the plating process at the first conductive surface. The disadvantage of plating equal or greater amounts of material at the second conductive surface is that the plating process may then seal up both ends of the aperture with plated material before the deposited bodies of material from the process can join together in the middle of the via or aperture. A void in the plated conductive material will thereby form, causing a break in the conductivity of the via.

Instead, and in accordance with the present invention, a method of selectively plating up a via or through hole formed in a substrate having conductive material on its upper and lower surfaces is disclosed. In the inventive method, a first electric potential is applied to the lower conductive material to plate up the via, while a second, different electric potential is applied to the upper conductive material to prevent dissolution or excessive plating of the upper material.

FIG. 1 is a cross-sectional side view of a substrate 10 having a conductive material on its upper 12 and lower 14 surfaces. A blind via 16 extends through conductive material 12 and substrate 10 down to the surface of conductive material 14. Via 16 may be formed by laser drill or a suitable wet or dry etch process.

FIG. 2 is a cross-sectional side view of substrate 10 of FIG. 1, where a dielectric material (elements 20 and 22) has been deposited over the conductive material on the upper and lower surfaces of the substrate. Dielectric 20 and 22 is typically a layer of photoresist which is placed over conductive surfaces 12 and 14 to facilitate further processing of substrate 10. Note that substrate 10 and conductive layers 12 and 14 of FIGS. 1 and 2 may be representative of one of a plurality of such structures which are combined into a multi-layered structure of alternating conductive and dielectric layers.

As discussed, a problem encountered when attempting to plate a blind via upward from the lower conductive surface of the substrate is that the upper conductive surface will be dissolved in the plating bath if the upper and lower conductive surfaces are not electrically connected. In contrast, if the upper and lower conductive surfaces are electrically connected, then the upper surface will be plated up with an undesired layer of conductive material (approximately equal to the height of the via). Both of these situations produce an undesirable final structure. The present invention provides a solution to this problem.

FIG. 3 is a cross-sectional side view of a substrate, showing how the inventive method may be used to plate a blind via in a substrate having a conductive material on its upper and lower surfaces. In the figure, a substrate 100 is shown having an upper and lower surface on which are arranged an upper 102 and a lower 104 conductive layer. Dielectric layers 106 and 108 are arranged over conductive layers 102 and 104, although this is not required for practice of the invention. Substrate 100 and its associated material layers are placed into a suitable plating bath (not shown).

A power supply 120 is used to apply a first electric potential between an anode electrode in the bath (not shown, but connected to node 140) and conductive layer 102 and a second, different electric potential between the anode electrode and conductive layer 104. This configuration is suited for the situation in which the upper and lower conductive layers are not electrically connected. The lower conductive layer will serve as the cathode for the electroplating of the blind via, while the potential applied to the upper conductive layer (which serves as a second cathode) can be set to induce a minor degree of electrodeposition or electrodissolution for that layer. This permits control of the final thickness of the upper conductive layer at the end of the via plating process.

FIG. 4 is a cross-sectional side view of a substrate, showing how the inventive method may be used to plate a through hole in a substrate having a conductive material on its upper and lower surfaces. In the case of a through hole, plating up of the hole will occur after the bottom of the hole is closed as the result of the merging of conductive deposits 150 at the edges of the bottom of the through hole which are formed during the electroplating process.

Note that in both FIG. 3 and FIG. 4, resistive element 122 is utilized to prevent a short circuit and possible damage to power supply 120 when the conductive material filling up the via or through hole electrically contacts the upper conductive layer.

A plating bath suited for use with the inventive method is a solution of six percent (6%) copper sulfate and fifteen percent (15%) sulfuric acid, at room temperature. The plating potential is approximately 30 milli-amps per square centimeter (30 mA/cm$^2$) of surface area of the lower conductive layer, with a plating time of approximately 10 minutes. Note that this is only a representative example of the plating conditions and parameters, and other combinations could be used in accordance with the herein described invention.

The values of the electric potentials applied to the upper and lower conductive layers are a function of the seed layer resistance, plating solution resistance, separation between the anode and cathode, and the similarity or difference between the materials which form the two conductive layers, among other factors. In practice, the applied current density is selected, which controls the corresponding electro potential(s). In this regard, the applied current density on the bottom conductive layer can be selected to be a multiple of the magnitude of that applied to the upper conductive layer (e.g., 40 mA/cm$^2$ on the bottom layer and 20 mA/cm$^2$ on the upper layer). This will result in a plating thickness on the bottom layer which is a multiple of that on the upper layer over the same period of time. This method of setting the electro potentials can be used in the case of both similar or dissimilar materials for the two conductive layers.

While the present invention has been particularly described with respect to the illustrated embodiment, it will be appreciated that various alterations, modifications and adaptations may be made based on the present disclosure, and are intended to be within the scope of the present invention and the appended claims. For example, although the inventive method has been described with reference to the plating of a via or through hole in a substrate having conductive layers on its surfaces, the method may also be used to plate a via or through hole between two more general regions of conductive material, e.g., conductive traces or patches. Furthermore, although the substrate in which the via or through hole is formed is typically composed of a dielectric material, it may also be formed from a semiconductor material.

What is claimed is:

1. A method of plating a conductive material in an aperture, comprising:

providing a structure having an aperture passing between a first conductive region and a second conductive region, wherein the first and second conductive regions are disposed on a first and second surface of a substrate;

applying a first potential difference between an anode and the first conductive region;

applying a second potential difference between the anode and the second conductive region, wherein the first potential difference is different than the second potential difference; and plating a conductive material within the aperture and onto the first region of conductive material.

2. The method of claim 1, further comprising:

disposing a resistive element in the electrical path between the second conductive region and a source of the second potential difference.

3. The method of claim 1, wherein the value of the first potential difference is a multiple of the value of the second potential difference.

4. A method of plating a conductive material on a structure, said structure having a non-conductive layer, an aperture in said non-conductive layer, a first region of said conductive material adjacent to the aperture, and a second region of said conductive material adjacent to the aperture, said method comprising the steps of:

(a) placing said structure in a plating bath;

(b) applying a first potential to said first region of said conductive material;

(c) applying a second potential to said second region of conductive material, said second potential being different from said first potential; and (d) plating a material onto said first region of said conductive material.

5. The method of claim 4, wherein said first region of conductive material comprises a conductive layer which covers an end of the aperture.

6. The method of claim 5, wherein said first region of conductive material comprises a ring of material disposed on the walls of the aperture.

7. A method of plating a conductive material on a structure, said structure having a dielectric layer, an aperture in said dielectric layer, a first region of said conductive material adjacent to the aperture, and a second region of said conductive material adjacent to the aperture, said method comprising the steps of:

(a) placing said structure in a plating bath;

(b) placing an anode electrode in said plating bath;

(c) applying a first potential difference between said first region of said conductive material and said anode electrode;

(d) applying a second potential difference between said second region of conductive material and said anode electrode, said second potential difference being different from said first potential difference; and (e) plating a material onto said first region of said conductive material.

8. A method of plating conductive material on a structure comprising the steps of:

(a) forming an aperture in the structure such that the aperture exposes a first region of conductive material adjacent to the aperture and a second region of conductive material adjacent to the aperture;

(b) placing said structure in a plating bath;

(c) applying a first potential to said first region of conductive material;

(d) applying a second potential to said second region of conductive material, said second potential being different from said first potential; and (e) plating material onto said first region of conductive material.

9. A method of plating conductive material on a structure comprising the steps of:

(a) forming an aperture in the structure such that the aperture exposes a first region of conductive material adjacent to the aperture;

(b) forming a second region of conductive material adjacent to the aperture;

(c) placing said structure in a plating bath;

(d) applying a first potential to said first region of conductive material;

(e) applying a second potential to said second region of conductive material, said second potential being different from said first potential; and (f) plating material onto said first region of conductive material.

* * * * *